United States Patent
Yamamori

[11] Patent Number: 5,731,225
[45] Date of Patent: Mar. 24, 1998

[54] METHOD FOR FABRICATING SEMICONDUCTOR DEVICE HAVING BURIED CONTACT STRUCTURE

[75] Inventor: Atsushi Yamamori, Tokyo, Japan

[73] Assignee: NEC Corporation, Japan

[21] Appl. No.: 634,402

[22] Filed: Apr. 18, 1996

[30] Foreign Application Priority Data

Apr. 27, 1995 [JP] Japan ................................ 7-125677

[51] Int. Cl.[6] ................................................ H01L 21/283
[52] U.S. Cl. .................... 437/190; 437/192; 437/228 ST
[58] Field of Search ................ 437/41 GS, 41 SM, 437/192, 189, 190, 195, 228, 228 ST; 257/751, 752, 763

[56] References Cited

U.S. PATENT DOCUMENTS

| | | | |
|---|---|---|---|
| 4,487,678 | 12/1984 | Noguchi et al. | 204/298 |
| 5,227,337 | 7/1993 | Kadomura | 437/192 |
| 5,422,310 | 6/1995 | Ito | 437/192 |
| 5,521,119 | 5/1996 | Chen et al. | 437/187 |
| 5,521,121 | 5/1996 | Tsai et al. | 437/190 |

FOREIGN PATENT DOCUMENTS 6-140372   5/1994   Japan .

*Primary Examiner*—T. N. Quach
*Attorney, Agent, or Firm*—Hayes, Soloway, Hennessey, Grossman & Hage, P.C.

[57] ABSTRACT

A method of forming a tungsten plug is disclosed in which a blanket tungsten layer 16 is deposited on a conductive layer including a titanium nitride film 15 and thereafter etched back using $SF_6$ plasma until the surface of the titanium nitride (TiN) film 15 is exposed. At this time, fluorine in $SF_6$ adheres to the surface of the TiN film. The wafer thus treated is maintained in a vacuum atmosphere and then a removing step is performed to remove fluorine from the surface of the TiN film.

3 Claims, 4 Drawing Sheets

METHOD FOR FABRICATING SEMICONDUCTOR DEVICE HAVING BURIED CONTACT STRUCTURE

BACKGROUND OF THE INVENTION

The present invention relates to a method of producing a semiconductor device having the so-called buried contact structure and, more particularly, to an improvement in method for forming such a buried contact structure that employ a tungsten (W) plug.

In a semiconductor device, an electrical connection between lower-level and upper-level wiring layers or between a wiring layer and a semiconductor region is performed by providing a contact-hole or a via-hole in an interlayer insulating film inervening therebetween. As device integration density increases, the aspect ratio of contact or via-hole size to depth increases.

A conductive wiring layer such as a metal generally made of aluminum or an alloy consisting of aluminum and other metals such as silicon and copper is deposited by a spattering method to fill and connect the holes. However, an aluminum layer deposited by the spattering method cannot completely fill a hole having a large aspect ratio. Therefore, it has been proposed that the hole provided in the interlayer insulating film be filled with a refractory metal plug such as tungsten. Such a structure is called buried contact structure.

The hole with the tungsten plug is formed as follows: First, a silicon substrate having a diffusion region or a polysilicon layer serving as a lower-level wiring layer is covered with a silicon oxide film as an interlayer insulating film, and the silicon oxide film is selectively removed to form a contact-hole exposing a part of the diffusion region or a via-hole exposing a part of the lower-level wiring layer. Thereafter, a titanium (Ti) layer and a titanium nitride (TiN) layer are deposited in that order on the entire surface of the substrate, followed by forming a blanket tungsten layer by the CVD method using $WF_6H_2$ on the entire surface of the substrate. The blanket tungsten layer is then etched back using $SF_6$ until the surface of the TiN layer is exposed. The tungsten plug filling the hole is thus formed. Subsequently, an aluminum or aluminum alloy is deposited over the entire layer and then patterned to form an aluminum wiring layer.

In the method above-mentioned, however, fluorine is adhered on the TiN layer when the blanket tungsten layer is etched back the fluorine and titanium react to form using $SF_6$ and thereafter, grains of titanium fluoride on the TiN layer when the wafer is exposed to the atmosphere for a long time.

It has found that when a wafer is exposed to the atmosphere, moisture in the atmosphere reacts with the fluorine to form hydrogen fluoride (HF), the surface of the titanium nitride film is fluorinated by the hydrogen fluoride, and grains of titanium fluoride is formed. Moreover, the aluminum alloy film the forming wires may not be smoothly etched due to the grains of titanium fluoride or a short circuit may be formed between wires. The adherence of the aluminum alloy may be impaired resulting in reduced yield and reliability of the semiconductor devices.

The inventor has studied relationship between the number of occurring grains of titanium fluoride with time exposure of the wafer to the atmosphere after the blanket tungsten layer is etched back using $SF_6$. FIG. 3 shows the result of this study wherein the X axis represents the exposure time of the wafer in the atmosphere after the blanket tungsten layer is etched back by using $SF_6$ and the Y axis represents the number of occurring grains of titanium fluoride.

Referring to FIG. 3, the number of grains of titanium fluoride hardly increases within 4 hours in the atmosphere after the blanket tungsten layer is etched back using $SF_6$ but rapidly increases after 4 hours exposure. That is, substantially only fluorine will adhere to the titanium nitride in the first 4 hours.

Then, the fluorine on the TiN layer and the grains of titanium fluoride are removed using methods as disclosed in Japanese Laid-open Patent Application No. Hei 6-140372.

For example, the grains of titanium fluoride on the TiN layer may be removed by soaking the titanium nitride film in an alkali solution such as ammonia to slightly etch the surface of the film. Alternatively, the grains of titanium flouoride may be removed by etching using argon gas.

However, both methods etch the entire surface on the substrate. That is, since the tungsten plugs also are etched, a resistance between the lower-level layer and the upper-level layer increases. It is difficult to remove fluoride itself.

Accordingly, it is better to remove the fluorine before fluorine reacts with titanium.

The first method removing fluorine on the TiN layer is to remove the wafer with the fluorine on the TiN layer from the CVD chamber and heating the wafer in an inert gas before the fluorine reacts with titanium in the TiN layer. The second method is to soak the wafer in pure water to wash off the fluorine it reacts with the titanium.

A plurality of processes is required in series to complete production of semiconductor products. Therefore, the apparatus to remove fluorine is often used to produce other semiconductor products when the step of etching back the blanket tungsten using $SF_6$ is finished. However, the same etching apparatus may be needed for treating other semiconductor products. Moreover, the apparatus conditions used for etching the surface on the substrate and the apparatus conditions used to remove fluorine are difference. Accordingly, the wafer finishing to etch the blanket tungsten using $SF_6$ may be moved from the etching apparatus and left in the atmosphere. However, the etching apparatus is usually used continuously more than 4 hours. It becomes impossible to practice the first or second method for removing fluorine within 4 hours after the blanket tungsten is etched back using $SF_6$ in fact.

SUMMARY OF THE INVENTION

Therefore, it is an object of the present invention to provide a method for completely removing fluorine from the surface of a titanium nitride film even if a wafer is left for a long time after etching the whole surface of a blanket tungsten layer. It is another object of the present invention to provide a method for ensuring removal of the fluorine on a titanium nitride film within 4 hours after etching the whole surface of a blanket tungsten layer. It is still another object of the present invention to provide a method for improving the fabrication yield and reliability of semiconductor devices.

A method of fabricating semiconductor device of the present invention comprises the steps of:

forming a barrier layer containing titanium nitride on a semiconductor substrate;

depositing a blanket tungsten layer on the barrier layer;

etching back the blanket tungsten layer using a reactive gas containing fluorine until the surface of titanium nitride is exposed in a first chamber;

removing flurorine on the titanium nitride in a second chamber; and keeping the wafer in a vacuum atmosphere when transferring the wafer in the first chamber into the second chamber.

BRIEF DESCRIPTION OF THE DRAWINGS

The above and other objects, advantages, and featur of the present invention will be more apparent from the following description taken in conjunction with the accompanying drawings, in which.

DETAILED DESCRIPTION OF THE PREFERRED EMBODIMENTS

Referring now to FIG. 1, the description will be made below on the first embodiment of the present invention.

Figure 1A:
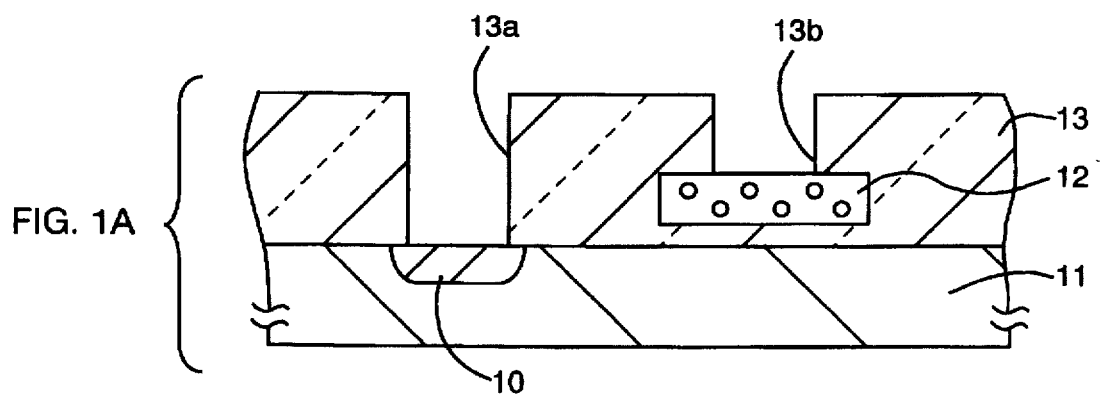
FIGS. 1A to 1E are cross sectional views illustrati of respective steps of producing a semiconductor device according to a embodiment of the present invention.

First, as shown in FIG. 1A, a silicon oxide film 13 is formed on a silicon substrate 11 with a diffusion layer 10. A polysilicon layer 12 serving as a lower-level wiring layer is formed and pattern-etched. The surface of the layer 12 is further covered with a silicon oxide film 13. Thereafter, a contact-hole 13a reaching the diffusion layer 10 and a via-hole 13b reaching the polysilicon layer 12 is formed at a desired position of the silicon oxide film 12 by a selective etching process.

Figure 1B:
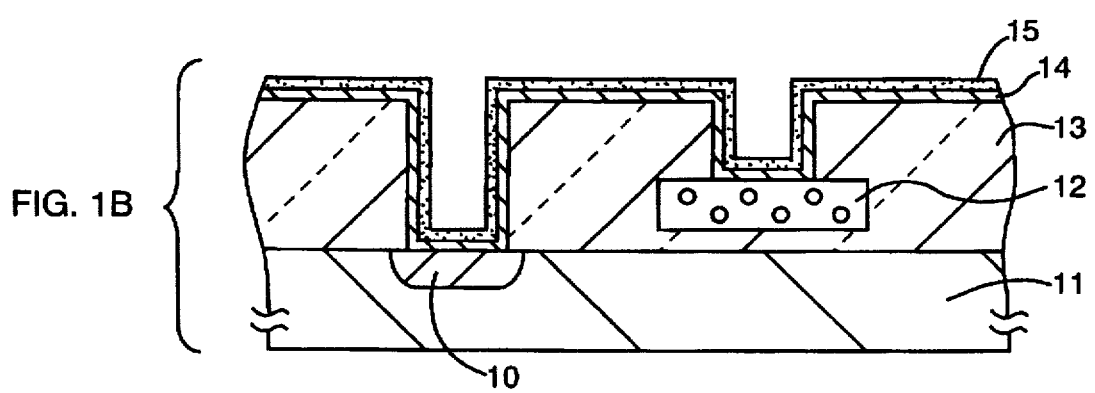

Then, as shown in FIG. 1B, a titanium film 14 and a titanium nitride film 15 are formed in that order by sputtering up to a thickness of 10 to 100 nm and a thickness of 50 to 200 nm respectively. The titanium film 14 is necessary to decrease contact resistances with the silicon substrate 11 and the polysilicon layer 12. Moreover, it is preferable that the titanium film 14 has a thickness of 10 nm or more at the bottom of the contact-hole 13a or the via-hole 13b and the film thickness is determined by the depth and diameter of the contact-hole 13a or the via-hole 13a. Furthermore, the titanium nitride film 15 is necessary to prevent a substrate or a polysilicon layer and $WF_6$ serving as a source gas for depositing tungsten from reacting each other.

Figure 1C:
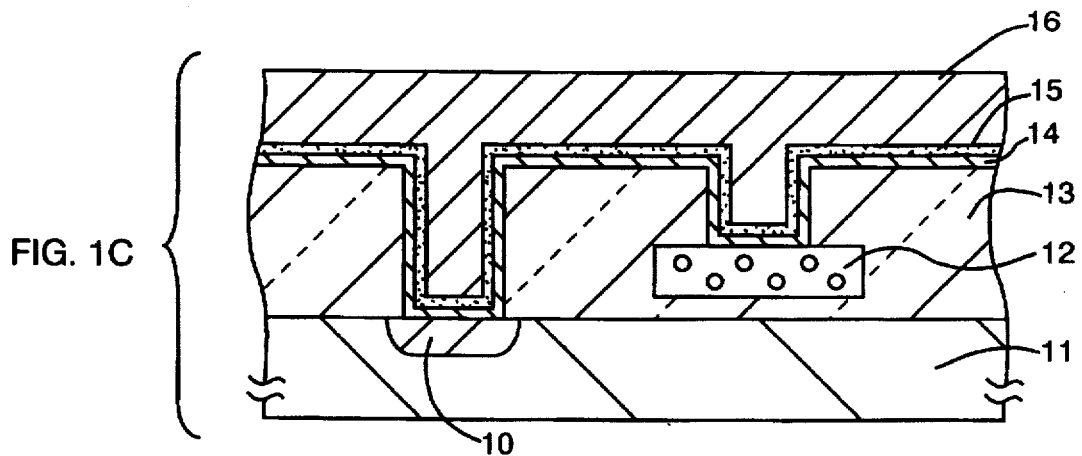

Then, as shown in FIG. 1C, a blanket tungsten layer 16 is formed up to a thickness of 0.5 to 1.0 μm by low-pressure chemical vapor deposition. To completely flatten a contact-hole 13a or a via-hole 13b, it is necessary to form the film 16 up to a thickness approximately equal to or more than the width (diameter) of the contact-hole 13a or the via-hole 13b. Moreover, the blanket tungsten layer 16 is mainly formed by a method of reducing $WF_6$ by hydrogen having a preferable covering property. Before forming the layer 16, however, it is preferable to deposit a thin tungsten film by reducing $WF_6$ by $SiH_4$ in order to stably form the blanket tungsten layer 16. Deposition of the blanket tungsten layer 16 is performed at a temperature of 400° to 500° C. and a pressure of several hundreds of mTorr.

Then, a post-treatment method etching back the whole surface of the blanket tungsten layer 16 is described below by referring to the semiconductor device fabrication system shown in FIG. 3. The system has 4 chambers. Each of the chambers has a vacuum pump (not shown). A load-lock chamber 1 has a gate valve 6 connected to outside of the system. An etching chamber 3 has a gas valve 5 such as an inert gas. A post-treatment chamber 4 has a gas valve 5 such as nitrogen gas. A vacuum chamber 2 has gate valves 7, 8, 9 connected to the chamber 1, 4, 3 respectively. The vacuum chamber 2 transfers a wafer among the chambers 1, 3, 5 while keeping a vacuum atmosphere.

First, a wafer formed the blanket tungsten layer 16 on the substrate is placed in load-lock chamber 1. Then, the wafer transferred to etching chamber 3 through a vacuum chamber 2.

Figure 1D:
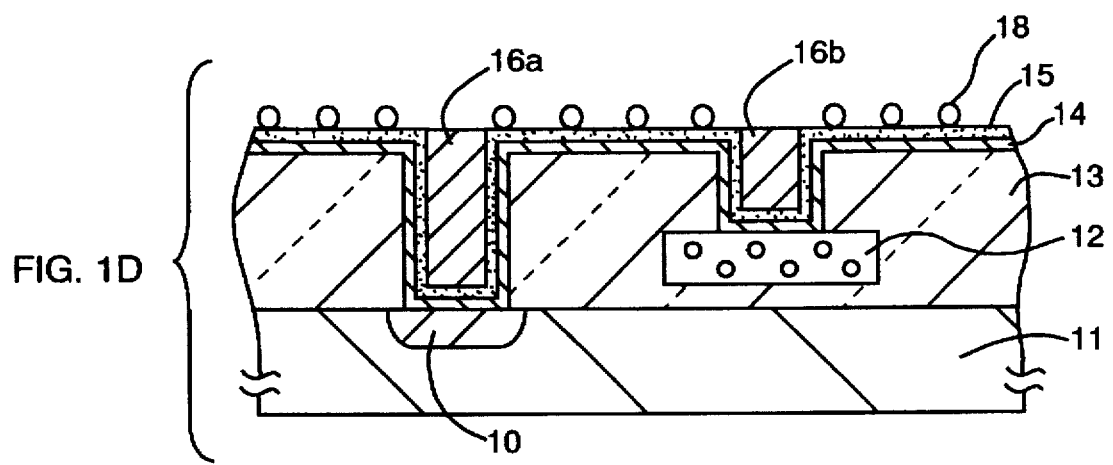

Then, as shown in FIG. 1D, the whole surface of the blanket tungsten layer 16 is dry-etched in $SF_6$ gas to expose the surface of the titanium nitride film 15 at a flat portion and leave the tungsten only in the via-hole 13b or the contact-hole 13a. A tungsten plug 16a,b filling the hole 13a, 13b respectively are thus formed. Just then, the fluorine 18 is adhered on titanium nitride film 15.

After the whole surface of the blanket tungsten layer on the wafer is etched back in the etching chamber 3, the wafer is transferred to a post-treatment chamber 4 through the vacuum chamber 2. Then, the wafer may be left in the vacuum chamber 2 for a long time, for example, more than 4 hours.

The fluorine 18 on the surface of the titanium nitride film 16 is dissociated and removed by setting the treatment pressure in the post-treatment chamber 4 to 0.3 Torr or lower, raising the wafer temperature to 220° C. or higher, and blowing nitrogen on the wafer surface for 20 sec or more. The fluorine also can be dissociated and removed by setting the treatment pressure in the vacuum chamber to 0.3 Torr or lower in the nitrogen gas, raising the wafer temperature 220° C. or higher. It is not fully understood why fluorine can be removed by this method. However, it is believed that the fluorine is removed by chemical action.

Figure 3:
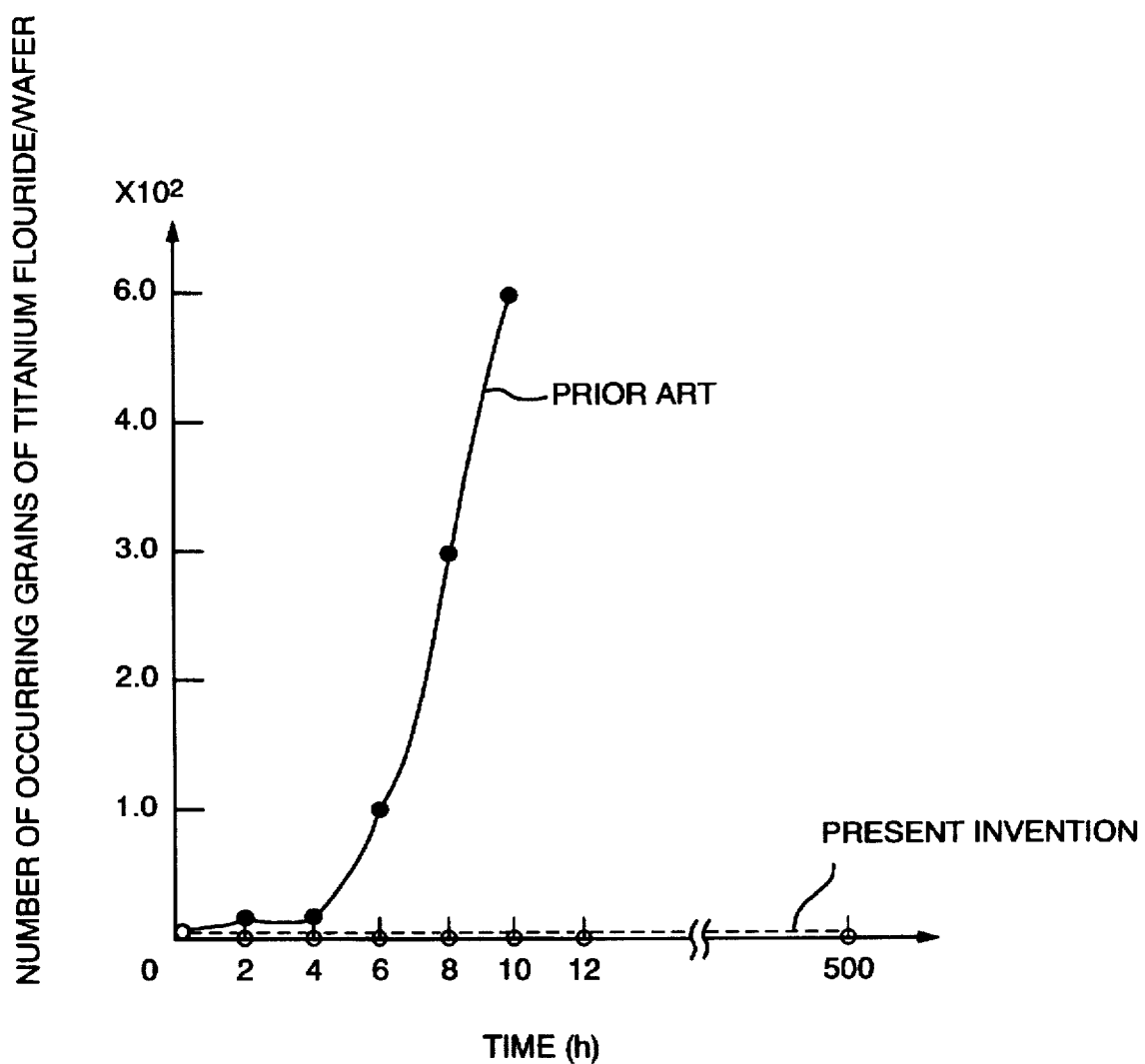
FIG. 3 is a graph for explaining advantages of the present invention and disadvantages of the prior art.

FIG. 3 shows residence relation between the time of the wafer in the atmosphere after the above treatment is applied to the wafer and the number of grains of titanium fluoride format by a broken line. As the result, titanium fluoride is not formed even if a wafer is left in the atmosphere for a long time.

It is possible to use not only nitrogen but also an inert gas such as helium, neon, or argon for the above treatment.

Figure 1E:
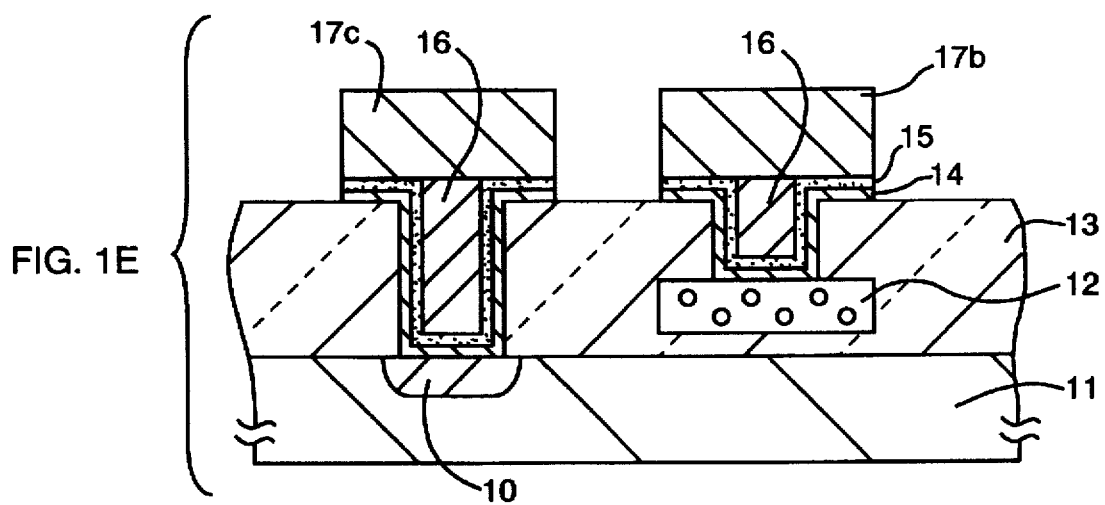
Figure 2:
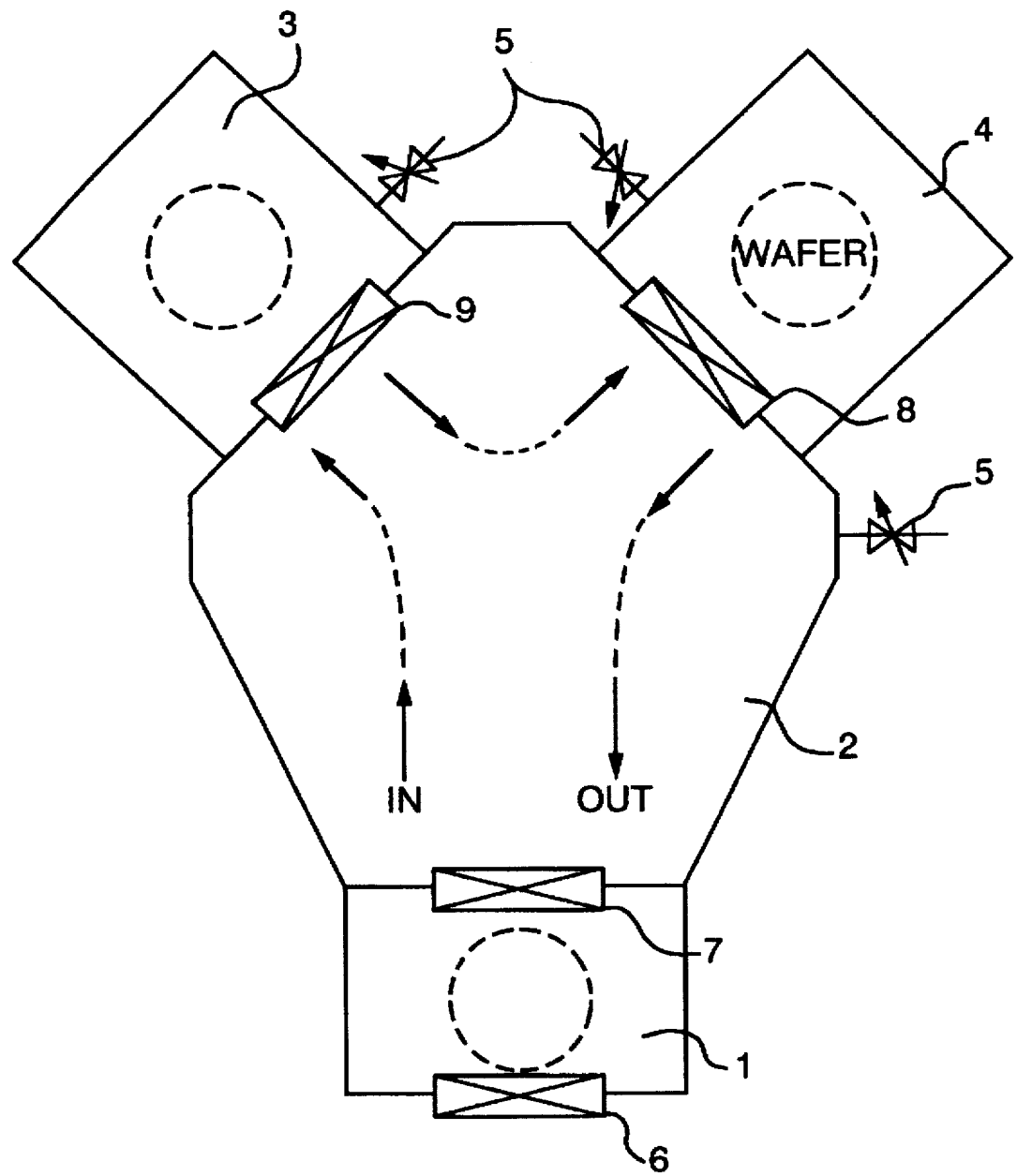
FIG. 2 is a schematic diagram of a semiconductor device fabrication system employed in the method shown in FIG. 1 for explaining an embodiment of the present invention.

Referring to FIG. 1E, an aluminum alloy film is deposited by sputtering. Thereafter, the aluminum alloy film, titanium nitride film 15, and titanium film. 14 are formed into desired shapes and patterned to form aluminum wiring layer 17a, 17b by photolithography and dry etching. Thus, a semiconductor device having a buried contact structure is produced.

The steps of etching back the blanket tungsten layer and removing fluorine are accomplished in their respective chambers. Because fluorine remains on the inner wall of a etching chamber 3 when the blanket tungsten layer is etched back using $SF_6$, therefore, fluorine attaches onto a titanium nitride film again.

Then, the method of removing the fluorine on the surface of the titanium nitride film according to the second embodiment of the present invention is described below. The method from FIG. 1A to 1D is the same method. Then, a wafer is exposed to hydrogen-gas plasma in the post-treatment chamber 4.

Fluorine adhering to the surface of a titanium nitride film on the wafer transferred to the post-treatment chamber 4 intermolecular binding energy between the titanium and the fluorine of 136 kcal/mol. However, the intermolecular binding energy between fluorine and hydrogen is 153 kcal/mol. Therefore, it is possible to separate or disassociates the bound titanium and fluorine from each other by plasma and remove the fluorine by a chemical reaction of hydrogen-gas plasma without applying thermal treatment.

As described above, the semiconductor device fabrication method of the present invention dry-etches a tungsten film on a titanium nitride film by a gas containing fluorine, then transfers the etched film to a post-treatment chamber from the etching chamber without exposing it to the atmosphere, and removing fluorine from the titanium nitride film in the post-treatment chamber. Therefore, it is possible to completely remove fluorine from the surface of the titanium nitride film and prevent grains of titanium fluoride from occurring on the surface of the titanium nitride film. Thus, the present invention makes it possible to form an aluminum wiring having a via-hole covered with a tungsten film at a high adhesiveness without causing a short circuit between wires and improve the yield and reliability of semiconductor devices.

It is apparent that the present invention is not limited to the above embodiments but may be modified and changed without from the scope and spirit of the invention.

What is claimed is:

1. A method of fabricating a semiconductor device comprising the steps of:

forming over a semiconductor substrate a conductive layer including titanium;

forming a tungsten film on said conductive layer;

etching back said tungsten film by using a reactive gas containing fluorine until a surface of said conductive layer is exposed; and heating said semiconductor substrate in a temperature of 220° C. or higher in an inert gas to thereby remove fluorine from the surface of said conductive layer without etching said conductive layer;

wherein said semiconductor substrate is kept in a vacuum atmosphere after the step of etching back until the step of heating.

2. A method of fabricating a semiconductor device comprising the steps of:

forming an insulating film on a semiconductor substrate;

selectively forming a hole in said insulating film to expose a part of said semiconductor substrate;

forming a barrier layer containing titanium nitride in contact with said insulating film and said part of said semiconductor substrate;

depositing tungsten on said barrier layer to form a tungsten blanket layer;

etching back said tungsten blanket layer by using a reactive gas containing fluorine until a surface of said barrier layer is exposed to thereby form a tungsten plug filling said hole;

keeping said semiconductor substrate having said tungsten plug in a vacuum atmosphere containing an inert gas;

releasing said semiconductor substrate from said vacuum atmosphere; and heating said semiconductor substrate in 220° C. or higher in an inert gas to thereby remove fluorine from said surface of said barrier layer without etching said barrier layer.

3. A method of fabricating a semiconductor device using such an apparatus that has a first chamber, a second chamber and a vacuum chamber coupled between said first and second chambers, said method comprising the steps of:

loading a semiconductor wafer into said first chamber, said semiconductor wafer including a conductive layer containing titanium and a tungsten layer formed on said conductive layer;

etching back said tungsten layer in said first chamber;

taking out said wafer from said first chamber and loading said wafer into said second chamber through said vacuum chamber; and heating said semiconductor substrate in 220° C. or higher in an inert gas in said second chamber to thereby remove fluorine from said surface of said barrier layer without etching said barrier layer.

* * * * *